(12) United States Patent
Rudiak et al.

(10) Patent No.: US 12,418,249 B2
(45) Date of Patent: Sep. 16, 2025

(54) CONTROLLER

(71) Applicant: NXP USA, INC., Austin, TX (US)

(72) Inventors: Jerry Rudiak, Phoenix, AZ (US);
David Domenic Putti, Novi, MI (US);
Ibrahim Shihadeh Kandah, Novi, MI (US)

(73) Assignee: NXP USA, Inc., Eindhoven (NL)

( * ) Notice: Subject to any disclaimer, the term of this patent is extended or adjusted under 35 U.S.C. 154(b) by 334 days.

(21) Appl. No.: 18/168,095

(22) Filed: Feb. 13, 2023

(65) Prior Publication Data

US 2023/0291330 A1    Sep. 14, 2023

(30) Foreign Application Priority Data

Mar. 10, 2022 (EP) .................................... 22161453

(51) Int. Cl.
| | | |
|---|---|---|
| *H02M 7/5387* | (2007.01) | |
| *H02J 9/06* | (2006.01) | |
| *H02M 1/00* | (2006.01) | |
| *H02M 1/08* | (2006.01) | |

(52) U.S. Cl.
CPC ......... *H02M 7/53873* (2013.01); *H02J 9/062* (2013.01); *H02M 1/0009* (2021.05); *H02M 1/08* (2013.01)

(58) Field of Classification Search
CPC .. H02M 7/53873; H02M 1/0009; H02M 1/08; H02M 1/327; H02M 1/44; H02M 3/158; H02M 7/5387; H02J 9/062; H03M 1/0863; H03M 1/12
See application file for complete search history.

(56) References Cited

U.S. PATENT DOCUMENTS

| | | |
|---|---|---|
| 9,608,623 B1 | 3/2017 | Kandah et al. |
| 11,133,814 B1 | 9/2021 | Patil et al. |
| 2013/0083565 A1 | 4/2013 | Gaknoki et al. |
| 2013/0300388 A1* | 11/2013 | Laur ...................... H02M 3/156 323/282 |
| 2014/0204628 A1 | 7/2014 | Gaknoki et al. |
| 2023/0170790 A1* | 6/2023 | Kandah ................. H02M 1/327 320/166 |

FOREIGN PATENT DOCUMENTS

WO    2012158938 A1    11/2012

OTHER PUBLICATIONS

Sun, Y., "Design of a Variable-Delay Window ADC for Switched-Mode DC-DC Converters", 2015 IEEE International Symposium on Circuits and Systems (ISCAS), May 24-27, 2015.

\* cited by examiner

*Primary Examiner* — Kyle J Moody (57) ABSTRACT

A controller for a power converter device, wherein the controller is configured to provide for switching of a switching component of the power converter device based on a feature in a control signal, sample at least one parameter of the power converter device upon expiry of a predetermined time period after switching of the switching component; and output the sample of the at least one parameter.

20 Claims, 3 Drawing Sheets

CONTROLLER

CROSS-REFERENCE TO RELATED APPLICATIONS

This application claims the priority under 35 U.S.C. § 119 of European Patent application no. 22161453.0, filed on 10 Mar. 2022, the contents of which are incorporated by reference herein.

FIELD

The present disclosure relates to a controller for a power converter device. It also relates to a method for sampling a parameter of said power converter device provided, at least in part, by said controller. The present disclosure also discloses a system comprising the controller.

BACKGROUND

Power converter devices, such as inverters, utilise a controller to control at least one switching component to achieve the desired performance, such as desired output voltage, current, frequency or measures of efficiency. Furthermore, to monitor and control the power converter device, parameters of various components within the power converter are sampled to provide feedback to the controller. Accurate sampling of these parameters can be challenging due to the electrical noise typically created during switching operations. Typically, the parameters are sampled using one or more analog to digital converters (ADCs) which can be formed as part of the controller or be external to the controller.

SUMMARY

According to a first aspect of the present disclosure there is provided a controller for a power converter device, wherein the controller is configured to:
provide for switching of a switching component of the power converter device based on a feature in a control signal;
sample at least one parameter of the power converter device upon expiry of a predetermined time period after switching of the switching component; and
output the sample of the at least one parameter.

In one or more embodiments the controller being configured to sample at least one parameter of the power converter device upon expiry of a predetermined time period comprises the controller being configured to:
activate a timer arrangement in response to detection of said feature in the control signal, and wherein
the timer arrangement is configured to delay, by the predetermined time period, sampling of at least one parameter of the power converter device.

In one or more embodiments the predetermined time period is user-defined and the controller includes a memory that is programmable for receiving the user-defined, predetermined time period, wherein the controller is configured to read the user-defined, predetermined time period from the memory and sample the at least one parameter of the power converter device upon expiry of the user-defined, predetermined time period after switching of the switching component.

In one or more embodiments the controller comprises at least one terminal and is configured to provide a programmable interface to receive an input at the at least one terminal to set the user-defined, predetermined time period that is stored in said memory.

In one or more embodiments the controller being configured to provide for switching of the switching component comprises the controller being configured to, in response to detecting the feature of the control signal, generate a further control signal configured for application to a control terminal of the switching component to at least one of open or close a conduction path through the switching component.

In one or more embodiments the predetermined time period comprises a first predetermined time period and the controller is configured to sample upon expiry of either the first predetermined time period or a different, second predetermined time period; wherein the controller is configured to:
sample a first parameter of the power converter upon expiry of the first predetermined time period after switching of the switching component; and
sample a second parameter of the power converter upon expiry of the second predetermined time period after switching of the switching component, wherein the second parameter is different to the first parameter.

In one or more embodiments the predetermined time period comprises a first predetermined time period and the controller is configured to sample upon expiry of either the first predetermined time period or a different, second predetermined time period; wherein the controller is configured to:
sample the at least one parameter of the power converter upon expiry of the first predetermined time period after switching of the switching component, wherein said switching comprises closing a conduction path through the switching component of the power converter device; and
sample the at least one parameter of the power converter upon expiry of the second predetermined time period after switching of the switching component, wherein said switching comprises opening a conduction path through the switching component of the power converter device.

In one or more embodiments the controller includes an analogue to digital converter, ADC, configured to sample the at least one parameter after the predetermined time period.

In one or more embodiments the timer arrangement is configured to delay, by the predetermined time period, activation of a sampling window of the ADC within which the at least one parameter is sampled.

In one or more embodiments the control signal comprises a logic control signal, and wherein the feature of the control signal comprises one or more of:
a rising edge of the logic control signal; and
a falling edge of the logic control signal.

In one or more embodiments the at least one parameter includes one of:
a temperature of the power converter device,
a voltage across at least one component of the power converter device, and
a current through at least one component of the power converter device.

In one or more embodiments the switching component comprises a power transistor that is controlled via a gate terminal and the controller includes a gate driver circuit to provide a voltage to the gate terminal to cause the switching component to switch based on the feature in the control signal.

In one or more embodiments, in response to detecting a first feature of the control signal, the ADC is configured to sample a first parameter of the power converter device, and in response to detecting a second feature of the control signal, the ADC is configured to sample a second parameter of the power converter device.

In one or more embodiments the power converter device is an inverter and the switching component is a power transistor.

According to a second aspect of the present disclosure there is provided a system comprising the controller and an inverter for powering a load, wherein the system comprises one of:

a vehicle, and an uninterruptible power supply, UPS.

According to a third aspect of the present disclosure there is provided a method for controlling the controller, the method comprising:

detecting a feature in a control signal;

switching a switching component of the power converter device in response to detection of said feature of the control signal;

sampling at least one parameter of the power converter device after expiry of a predetermined time period after switching of the switching component; and outputting the sample of the at least one parameter.

In one or more embodiments the at least one parameter of the power converter device after expiry of the predetermined time period comprises;

activating a timer arrangement in response to detection of said feature of the control signal to delay, by the predetermined time period, sampling of the at least one parameter of the power converter device.

In one or more embodiments reading a user-defined, predetermined time period from a memory of the controller; and controlling the timer arrangement based on said user-defined, predetermined time period.

In one or more embodiments receiving at a programmable interface, an input to set the user-defined, predetermined time period, storing, in said memory the user-defined, predetermined time period.

In one or more embodiments detecting a feature in the control signal;

generating a further control signal configured for application to a control terminal of the switching component to at least one of open or close a conduction path through the switching component.

In one or more embodiments sampling the at least one parameter of the power converter device, wherein the at least one parameter includes one of:

a temperature of the power converter device, a voltage across at least one component of the power converter device, and a current through at least one component of the power converter device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Power converter devices receive electrical power at an input, provide for conversion of that power in terms of one or more of its voltage, current or in terms of being AC or DC, and provide an output of the converted electrical power. For example, an inverter receives DC power at an input, uses a number of different components to convert the power to AC and provides an AC output having a desired current and voltage. Typically, the conversion and thereby the output current and output voltage is controlled by way of driving one or more switching components in the power converter device. Power converter devices typically have associated controllers to control the switching component(s).

It will be appreciated that in some examples the power converter device may be a power converter (such as an inverter or other power supply) and may be configured to provide its output to a power device such as a motor or other electrical load. It will be appreciated that the output of the power converter may be coupled to any electrical load and the power converter device may be configured to convert the input voltage to a suitable output voltage to power the particular load.

In one or more examples, the switching component may comprise a transistor, such as a power transistor, having a gate terminal (or more generally a control terminal) that controls current flow through the transistor. In one or more examples the controller includes a gate driver for providing a control signal to the gate terminal of the transistor. In other examples (not shown) the circuitry that comprises the gate driver may be separate from the controller and may be configured to control the switching component based on a signal received from the controller. The present disclosure relates to controllers that include the gate driver circuitry and those that are separate from the gate driver circuitry and coupled to the gate driver.

Controllers are increasingly being used to measure high-voltage-domain parameters (for example DC link voltage of an inverter). The controller may use an analogue to digital converter (ADC) to sample the parameters. In some examples the ADC may form part of the controller. In other examples the ADC may form part of the gate driver.

It will be appreciated that in some examples, for the controller of the present disclosure, parameters of an output side of power converter device may be sampled, where the output side comprises a part to be coupled to a power device.

In some other examples, parameters of the input side of power converter device may be sampled. It will be appreciated that the input side may be referred to as the low-voltage-domain and the output side may be referred to as the high-voltage-domain. In some other examples the input side may be at a relatively higher voltage than the low voltage side.

In one or more examples, sampling of high-voltage-domain parameters of the power converter device is problematic as fast current (dI/dt) and voltage (dV/dt) transitions, related to the opening and closing of the one or more switching components has been found to generate increased electrical noise. It has been found that in one or more examples, the electrical noise may be a cause of incorrect sampling of parameters (i.e. electrical or other parameters) of the power converter device, which in turn can lead to errors in controlling the power converter device.

Figure 1:
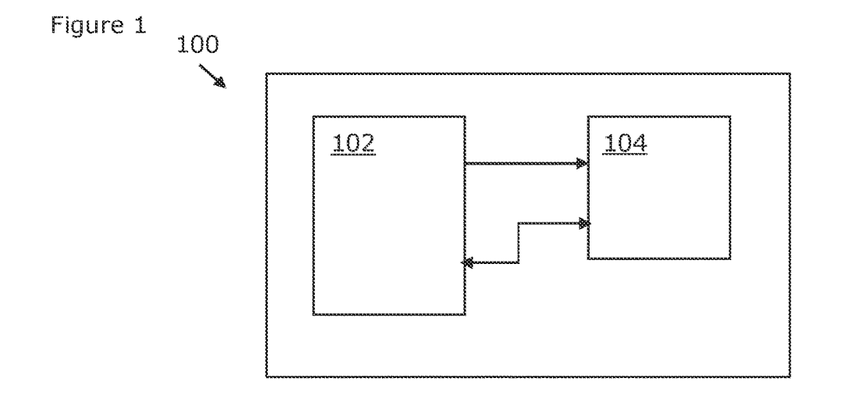
FIG. 1 shows an example of a system comprising a controller and a power converter device.

Example FIG. 1 shows a system 100 in which the controller 102 and power converter device 104 are shown.

In one or more examples, the system 100 comprises one of a vehicle or an uninterruptible power supply (UPS), although the disclosure is not limited to these two examples. In one or more examples, the power converter device 104 is an inverter, such as for converting DC power from a battery to AC power for powering a motor or other electrical load. It will be appreciated, the power converter device 104 may comprise any type of power converting device, such as a DC-DC converter as well as AC-DC converter.

Figure 2:
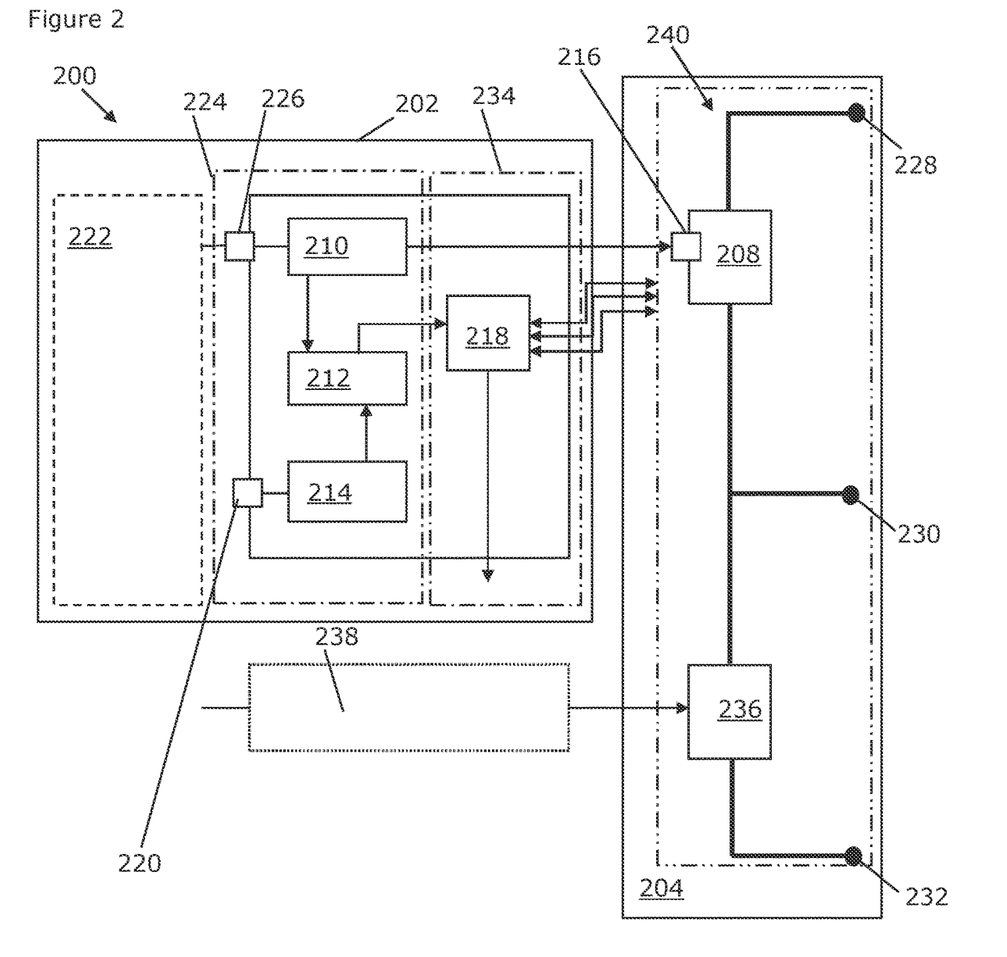
FIG. 2 shows an example embodiment of the controller for a power converter device.

FIG. 1 shows the general structure of the system 100 and FIG. 2 shows a more detailed embodiment. In FIG. 2, part of the system 100 is shown which comprises a combination 200 of a leg 240 of an inverter (i.e. part of the power converter device 104, 204) and an associated controller 202 (i.e. the controller 102 or at least a part of the controller 102). The leg 240 shown in FIG. 2 comprises a high side and a low side, as will be familiar to those skilled in the art. It will be appreciated that the leg 240 of the inverter generates one of the phases of the output of the inverter 104 and there may be multiple legs 240 to generate the multiple phases of the output voltage. It will be appreciated that in some examples the controller 202 may be or include a gate driver which can be coupled to a further microcontroller to receive a control signal.

The controller 202 is configured to provide for switching of a switching component 208 of the power converter device 204. As mentioned, in this embodiment the power converter device 204 is an inverter and the switching component 208 is a transistor for switching DC power input to the power converter device 204 to form an AC output at the terminals 228, 230, 232 of the leg 240 of the inverter. In some examples the transistor 208 includes a control terminal 216, which may typically comprise a gate terminal of said transistor for receiving the instructions to switch from the controller 202.

In one or more other examples (not shown) the switching component 208 may comprise a relay or other physical switch. It will be appreciated that any switching component that opens or closes a conduction path may be used.

The controller 102, 202 is configured to provide for switching of the switching component 208 of the power converter device 202 based on a feature in a control signal (described later with reference to FIG. 3). The control signal may be received by the controller 202 and may be used to generate an output that is applied to the switching component 208 to cause it to switch. In some examples the control signal may be generated by the controller 202 and the control signal may be directly applied to the switching component 208 to cause it to switch. In other examples the control signal may be applied to the switching component via one or more other components.

In one or more examples the switching component 208 may form part of a circuit of the power converter device 204 that may include one or more other components. The parameter of the power converter device 204 may therefore be a voltage across, or a current through the switching component 208 or any other component that forms part of the same circuit as the switching component 208.

An example circuit 240 of the power converter device 204 is shown in FIG. 2. The example circuit 240 comprises a common centre point terminal 230, an upper voltage rail 228 and a lower voltage rail 232. As mentioned previously, in some examples the circuit 240 comprises a leg 240 of an inverter for providing a phase of a multiphase output of the inverter. It will be appreciated that in this example, the controller 202 is not limited to controlling only a single leg of an inverter. In fact, it will be appreciated that in some examples the controller 202 may be configured to control multiple legs of a power converter device 204. In other examples each leg of the power converter device may have a dedicated controller 202.

The controller 202 may be further configured to control a plurality of switching components 208 which form a leg 240 of the inverter/power converter device 204 in a complementary manner to ensure correct operation of the power converter device 204. According to the example of FIG. 2 the controller 202 may control the switching component 208 in a positive part of the leg 240 of the inverter and control a switching component 236 in a negative part of the leg 240 of the inverter. In other examples, a separate controller 238 similar to the controller 202 may control the switching component 236 and sample parameters of it.

The controller 102, 202 is also configured to sample at least one parameter of the power converter device 204 upon expiry of a predetermined time period after the switching of the switching component 208 and to output the sample of the at least one parameter.

The effect of the (non-zero) predetermined time period is that the parameter of the power converter device can be sampled after a delay following opening or closing of the switching component 208, wherein the delay is defined by the predetermined time period. The predetermined time period may be defined to ensure that the parameter of the power converter device 104, 204 is sampled after the electrical noise caused by the switching of the switching component 208 has decayed to an acceptable level. Thus, the parameter of the power converter device 204 to be sampled, is sampled "away" from noisy edges and transitions to achieve better signal integrity.

In the examples that follow the predetermined time period begins based on the feature of the control signal that instructs or causes the switching component 208 to open or close. However, in other examples, the predetermined time period begins based on detection that the switching component 208 has opened or closed. In some examples, the instructing of the switching component to switch and the actual switching may be sufficiently close in time that one is equivalent to the other.

In one or more examples, the parameter of the power converter device 104, 204 sampled by the controller 102, 202 may be used as part of a feedback control loop for subsequent control of the switching component 208. Providing the feedback to the controller 102, 202 may allow for the controller 202 to adapt the control signal such as to maintain a desired performance of the power converter device 104, 204 in terms of its voltage, current and frequency. Thus, the controller 202 may be configured to control the power converter device 204, including the switching component 208, based on said feedback signal. In some examples the controller 202 may be configured to compensate for changes to the internal components of the power converter device 204 or to changes to a load coupled to the power converter device based on the sampled parameter of the power converter device 204. It will be appreciated that said compensation may be by way of controlling when the parameter of the power converter device 204 is sampled (by controlling the predetermined time period) or in some other examples may also include controlling switching of the switching component 208 to maintain and/or control the output characteristics of the power converter device 204.

To provide further context, it can be appreciated that the power converter device 204 may operate at relatively high voltages, while the controller 202 may operate at relatively low voltages. The need for the controller 202 to provide high-voltages that cause the switching component 208 to switch while operating based on low-voltage signals may necessitate the controller 202 having a low voltage side 224 and a high voltage side 234. Thus, the controller 202 may comprise a gate driver for the power transistor 208. The low voltage side 224 may be configured to receive the control signal and the high voltage side 234 may be configured to be coupled to the at least one switching component 208. The high voltage side 234 and the low voltage side 224 of the controller 202 may be formed on a common die and be separated by a high voltage isolation barrier (not shown). The high voltage isolation barrier may be configured to electrically isolate the high voltage side 234 from the low voltage side 224 of the controller 202. In one or more examples, the isolation may be achieved by increasing the physical separation of the low voltage side and the high voltage side of the controller. In other different examples the high voltage side and low voltage side of the controller may be on two separate dies with adequate insulation and an interconnection therebetween.

Thus, to enable accurate control of the power converter device 204, it may be necessary to sample the parameters of the power converter device 204 at the high voltage side 234 and convey the sampled values to the low voltage side 224.

In one or more examples the low voltage side 224 of the controller 202 may include a terminal 226 configured to receive the control signal. In some other examples the low voltage side 224 may be configured to generate the control signal internally and provide the control signal to the high voltage side via an interconnect. Irrespective of the origin of the control signal, the high voltage side may then provide an appropriate voltage to the control terminal of the switching component 208 to cause it to switch based on detecting the feature of the control signal. In such an example, the controller 202 may be considered to include a gate driver.

In some examples (not shown) the gate driver may be separate from the controller 202 and may be configured to, based on detecting the at least one parameter of the power converter device 204, control the predetermined time period. In such an example the gate driver may be considered as being an intelligent-gate-driver.

In one or more other examples the intelligent-gate-driver may also be configured to control when to sample at least one parameter of the power converter device 204 (by controlling the predetermined time period) and/or when to output the sample of the at least one parameter of the power converter device.

Also shown in FIG. 2 is a further controller 222 which can be formed on a separate die to the controller 202 and coupled to the low voltage side 224 of the controller. In other examples the further controller 222 may be formed on the low voltage side 224 of the same die as the controller 202. In one or more examples, the controller 202 may be configured to receive the control signal from the further controller 222 and, in response to detection of said feature of the control signal, the controller 202 may be configured to provide an output signal (of a suitable voltage) to cause the switching of the switching component 208. It will be appreciated that in other examples, the control signal may be generated by the controller 202 internally, rather than being received from the further controller 222.

Figure 3:
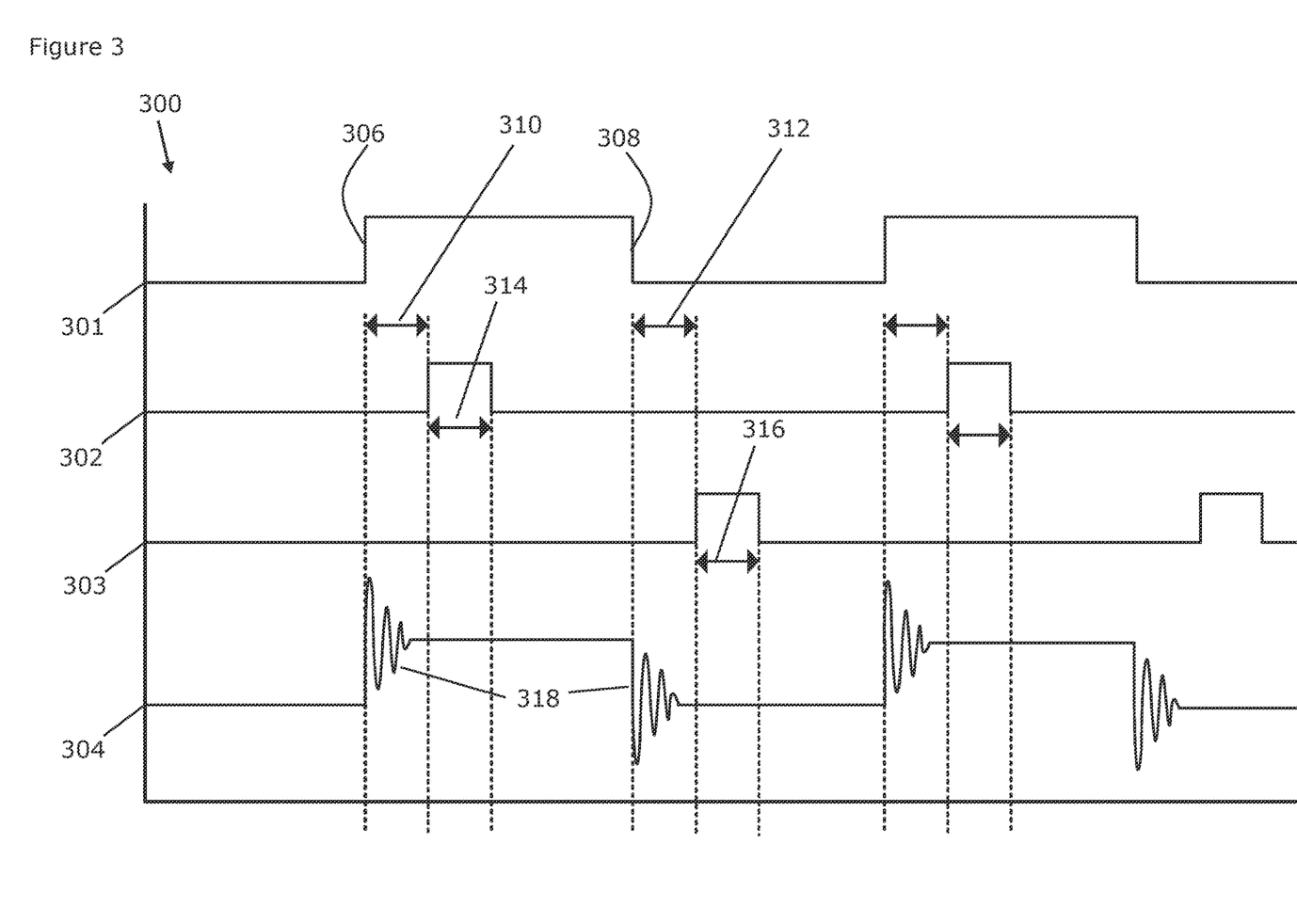
FIG. 3 shows example waveforms indicating the signals provided to and from the controller including a control signal and sampling of a parameter of the power converter device.

FIG. 3 shows a set of representative waveforms 301-304 which identify the various signals that are provided to or generated by the controller 202. An example control signal 301 will be described and FIG. 3 will be revisited later.

The control signal 301 may comprise a pulse width modulated (PWM) signal and the feature in the control signal that provides for switching of the switching component 208 may be an edge. Thus, in one or more examples the control signal 301 may be a logic control signal having a first logic state and a second logic state and an edge. The edge may be defined as the logic control signal going from first to second logic state or from second to first logic state and may comprise the feature that causes switching of the switching component. The control signal 301 of example FIG. 3 shows a first feature 306 comprising a rising edge. The control signal 301 shows a second feature 308 comprising a falling edge.

The representative waveforms 301-304 of FIG. 3 will be used to describe the operation of the controller 202 according to one example embodiment. However, it will be appreciated that the specific operation described in the following sections is not to be considered as the only embodiment of the controller and the example embodiment below is only to illustrate the concepts.

FIG. 2 further shows a detector 210, a timer arrangement 212, a memory 214 as well as a sampling circuit 218 which may form part of the controller 202. In an example embodiment, the controller 202 may be configured to sample at least one parameter of the power converter device 204 using the sampling circuit 218 after expiry of the predetermined time period, where the predetermined time period is measured by the timer arrangement 212.

It will also be appreciated that in some examples (not shown) the detector 210, the timer arrangement 212, the memory 214 as well as the sampling circuit 218 may each form part of the intelligent-gate-driver and not the main controller 202. It will be appreciated that in some examples the intelligent-gate-driver may comprise one or more of the above components.

In one or more examples, the detector 210 is configured to detect one or more features 306, 308 in the control signal 301 that provide for switching of the switching component 208. Detection of the features 306, 308 may be used to determine from when the predetermined time period begins or more particularly when the timer arrangement 212 starts its countdown of the predetermined time period and therefore when the sampling of the parameter occurs. Thus, in one or more example embodiments, the feature of the control signal 301 that is detected by the detector 210 of the controller 202 comprises one or more of the rising edge 306 of the logic control signal and the falling edge 308 of the logic control signal.

In one or more examples, the detector 210 may also be the entity that provides for said switching of the switching component 208 in response to detecting the one or more features 306, 308. Thus, in response to detection of the features 306, 308 of the control signal 301, the controller 202 may be configured to generate at least one further control signal (not shown) to cause switching of the switching component 208.

FIG. 3 also shows output signals 302, 303 for controlling the sampling circuit 218. It will be appreciated that the output signals 302 and 303 are generated after the timer arrangement 212 has determined that the predetermined time period has expired. In one or more examples, the output signals 302, 303 may be configured to cause a sample of the parameter to be taken, such as by activation of the sampling circuit 218. The sampling circuit 218 may comprise at least one ADC and the controller 202 may be configured to control the least one ADC to sample the parameter of the power converter device 204 after the predetermined time period has expired, such as in direct response to expiry of the predetermined time period.

In one or more examples, the output signals 302, 303 may each be configured to be coupled to different ADCs within the controller 202. In another example the output signals 302, 303 may each be configured to be coupled to the same ADC 218 and be configured to control the start and end of a sampling window of the ADC 218 respectively.

The ADC sampling window is defined as the time between a start-of-conversion and an end-of-conversion signal provided to the ADC. In some examples the ADC may be configured to provide an output during the sampling window. In an alternative embodiment (not shown), the controller 202 may include a buffer to receive a stream of samples from the ADC and wherein the controller 202 may be configured to read the sample of the at least one parameter, that is to be output, from the buffer after said predetermined time period.

In one example, the predetermined time period may be set during manufacture of the controller 202 and stored in the memory 214. The timer arrangement 212 may thus be configured to read the predetermined time period from the memory 214 when counting down to when the sample should be taken by the sampling circuit 218.

In an example embodiment, the controller 202 being configured to distinguish between the different first and second features 306, 308 of the control signal 301 may enable the controller 202 to apply a different predetermined time period in response to detecting a rising edge 306 as opposed to detecting a falling edge 308 of the control signal 301. This may be advantageous in examples where the controller 202 detecting the rising edge 306 of the control signal 301 may cause the controller 202 to perform a first action and where the controller detecting the falling edge 308 of the control signal 301 may cause the controller 202 to perform a second, different action as will be described later.

In another example embodiment, the controller 202 may further be configured to activate the timer arrangement 212 in response to detection of said feature 306, 308 of the control signal 301 by a detector circuit 210. The timer arrangement 212 may be configured to delay, by the predetermined time period 310, 312, sampling by the sampling circuit 218 of at least one parameter 304 of the power converter device 204.

It will be appreciated that delaying by the predetermined time period 310, 312, sampling of at least one parameter 304 of the power converter device 204 may allow for the sampling of the parameter of the power converter device 204 to be performed after any electromagnetic (EM) noise induced by the transients caused by the opening or closing of the conduction path across the switching component 208 has reduced to an acceptable level. Thus, this may allow for a more accurate measurement of the parameter 304 of the power converter device 204 and to improve signal integrity. In some examples the predetermined time period may be further controlled by the intelligent-gate-driver without any further input from the controller 202 itself.

In some examples each parameter of the power converter device may be sampled by a different ADC or alternatively a common ADC may be used for sampling each parameter in sequence. It will be appreciated that a dedicated ADC for each parameter can allow for faster sampling of all the parameters (parallel sampling) and can also allow for a suitable ADC to be used based on the parameter of the power converter device 204 to be sampled.

In some example embodiments, the memory 214 may be programmable with said predetermined time period 310, 312, and the controller 202 may be configured to read a user-defined, predetermined time period from the memory 214 of the controller 202 and control the timer arrangement 212 based on said user-defined, predetermined time period.

In one or more embodiments the predetermined time period 310, 312 may be read from the memory 214 upon detecting the feature 306, 308 of the control signal 301.

It will be appreciated that programming the controller 202 with a user-defined, predetermined time period 310, 312 may allow a controller to be customized for use with a particular power converter device 204. Thus, the predetermined time period can be varied by the user or selected from memory 214 such as to allow for selection of different predetermined time periods after switching of the switching device 208 based on the parameter of the power converter device 202 that is to be sampled.

In some example embodiments, to provide for the user-defined predetermined time period, the controller 202 may comprise at least one terminal 220 and may be configured to provide a programmable interface to receive an input at the at least one terminal 220 to set the user-defined, predetermined time period that may be stored in said memory 214. The programmable interface may comprise an SPI interface. It will also be appreciated that not only the predetermined time period, but also the temporal size of the sampling window 314, 316 of the ADC 218 may be configurable.

It will be appreciated that providing the terminal 220 to set the user-defined, predetermined time period may allow for simple and effective adjustment of the predetermined time period.

It will be appreciated that the user may determine the predetermined time period 310, 312 based on the ringing characteristics of the circuit 204.

In one or more examples the predetermined time period can be set between 1-8 microseconds, in another example the predetermined time period may be between 2 and 8 microseconds however any delay can be set by the user.

In some examples the controller 202 may be configured to enable or disable providing a delay between switching the switching component 208 and sampling the parameter of the power converter device 204 based on receiving a delay-enable signal. In some examples the delay-enable signal may be a logic signal in which the delay is enabled whilst the delay-enable signal is in a first state and the delay is disabled when the delay-enable signal is in a second different state.

Thus, the controller 202 may be configured to operate in two modes, the first mode being a delay-mode and the second mode being a no-delay-mode, and wherein the controller 202 is configured to receive a delay-control-signal, wherein upon detecting the delay-control-signal, the controller is configured to operate in the delay-mode and when the delay-control-signal is not detected, the controller is configured to operate in a no-delay-mode.

It will be appreciated that opening the conduction path through the switching component 208 may result in a different level of EM noise/ringing than when the conduction path through the switching component 208 is closed. Furthermore, it will be appreciated that the transient signals that are generated by the operation of the switching component 208 can lead to different ringing characteristics and as such different predetermined time periods may be required.

Thus, in one or more embodiments, the controller 202 and memory 214 may provide a first predetermined time period and a second predetermined time period 312. In some examples the controller 202 may be configured to delay the sampling of the at least one parameter of the power converter device 204 by either the first predetermined time period 310 or a different, second predetermined time period 312.

In some example embodiments the controller 202 may be configured to delay, by the first predetermined time period 310, sampling of a first parameter 304 of the power converter device 204 and delay, by the second predetermined time period 312, sampling of a second parameter, different to the first parameter 304 of the power converter device 204.

The advantage of applying different delays 310, 312 for measuring different parameters 304 of the power converter device 204 is that it may allow suitable delays to be defined which can ensure that the parameter is sampled as soon as the electromagnetic noise reduces to an acceptable level to allow the controller 202 to obtain a better indication of the state of the power converter device 204.

In other example embodiments the controller 202 may be configured to delay by the first predetermined time period 310, sampling of the at least one parameter of the power converter device 204 in response to closing a conduction path through the switching component 208 of the power converter device 204 and delay, by the second predetermined time period 312, sampling of the at least one parameter of the power converter device 204 in response to opening a conduction path through the switching component 208 of the power converter device 204.

The parameter sampled by the sampling circuit 218 may be an electrical parameter, such as voltage, current or frequency. Alternatively, the parameter may be non-electrical, such as temperature. The temperature may be that of a particular component, such as the switching component 208 of the power converter device. In another example the temperature may be that of a casing of a power transistor 208 or any other circuit component that forms part of the circuit 240 of the power converter device 204. Alternatively, in another example the temperature may be the bulk temperature of the controller 202 housing or the temperature of a component of the circuit coupled to the power converter device 204.

In one or more example embodiments the parameter 304 may be a voltage across at least one component, such as the switching component 208, 236, or any other circuit component of the power converter device 204, such as a component which forms part of a leg 240 of an inverter.

In other example embodiments the parameter 304 may be a current flowing through at least one component of the power converter device 204.

In one or more examples the sampling of the parameter of the power converter device includes interleaving the sampling of high-voltage-domain parameters such as temperature or the output voltage or output current based on detecting a different feature such as the rising edge 306 or the falling edge 308 of the control signal respectively.

It will also be appreciated that monitoring or sampling one or more parameters of the power converter device 204 may allow for accurate control of the output of the power converter device.

Figure 4:
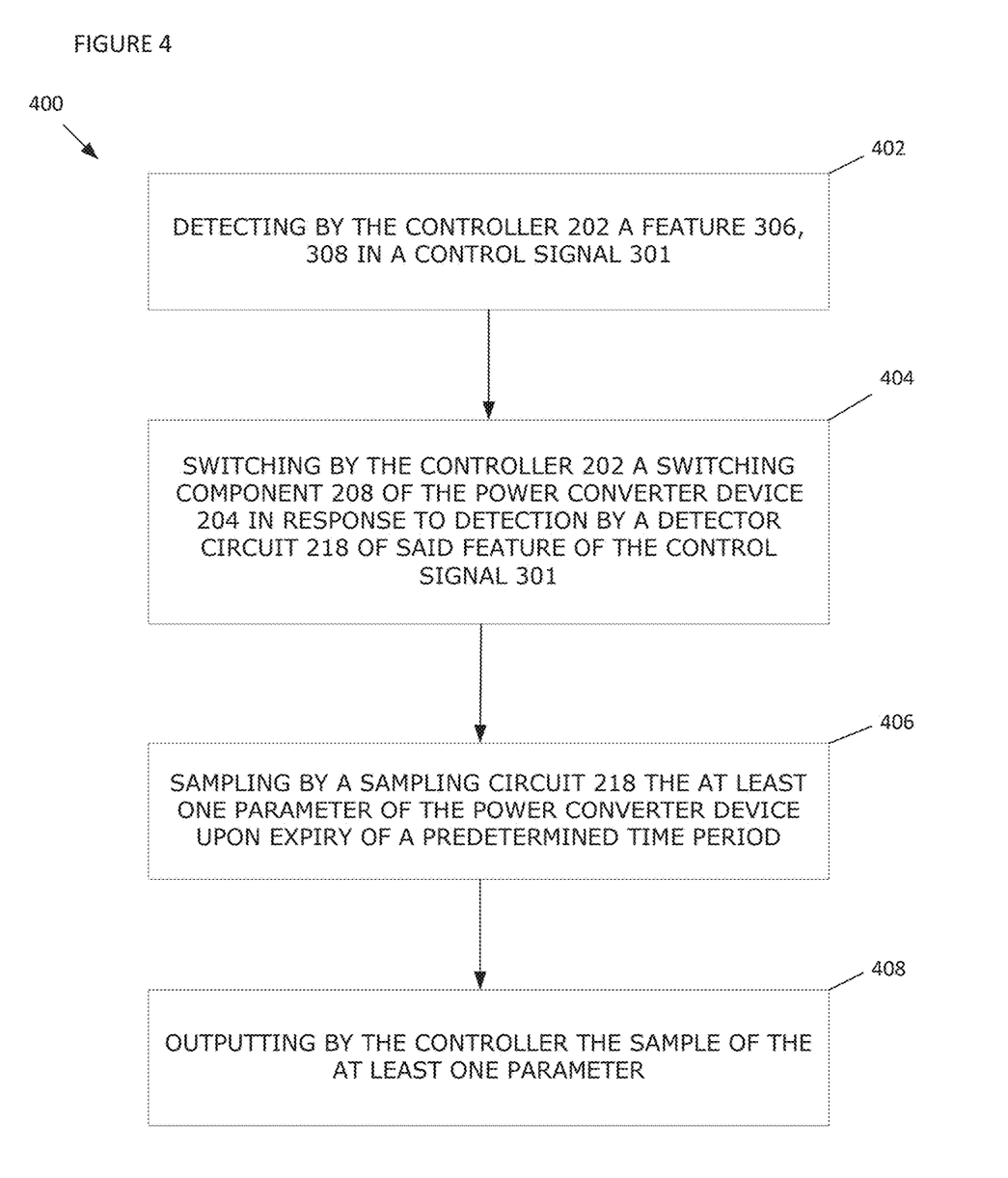
FIG. 4 shows an example method for controlling the controller.

FIG. 4 shows an example method 400 for controlling the controller based on detecting a feature in a control signal.

In one or more embodiments the method 400 includes the following steps. At step 402, detecting by the controller 202 a feature 306, 308 in a control signal 301. At step 404, switching by the controller 202 a switching component 208 of the power converter device 204 in response to detection by a detector circuit 218 of said feature of the control signal 301. The method further comprises, at step 406, sampling by a sampling circuit 218 the at least one parameter of the power converter device upon expiry of a predetermined time period. The method, at step 408 also includes outputting by the controller the sample of the at least one parameter.

In one or more examples the method 400 further includes activating by the controller 202 a timer arrangement 212 in response to detection, by the detection circuit 210 of said feature of the control signal 301 to delay, by the predetermined time period, sampling by the sampling circuit 218 of the at least one parameter of the power converter device 204 from the time of switching of the switching component.

In one or more examples the method 400 further includes reading by the controller 202 a user-defined, predetermined time period 310 from a memory 214 of the controller 202. The method further comprises controlling the timer arrangement 212 based on said user-defined, predetermined time period 310.

In one or more examples the method 400 further includes, prior to step 402, receiving by the controller 202 at a programmable interface 220, an input to set the user-defined, predetermined time period 310. The method further comprising storing, in said memory 214 the user-defined, predetermined time period 310.

In one or more examples the method 400 further includes detecting by the detection circuit 218 a feature in the control signal 301. The method further comprises generating by the controller 202 an output signal 302, 303 configured for application to a control terminal 216 of the switching component 208 to at least one of open or close a conduction path through the switching component 208.

In one or more examples the method 400 further includes sampling by the sampling circuit 218 the at least one parameter 304 of the power converter device 204 wherein the at least one parameter includes a temperature of the power converter device. In one or more examples the method 400 further includes sampling by the sampling circuit 218 the at least one parameter 304 of the power converter device 204 wherein the at least one parameter 304 includes a voltage across at least one component of the power converter device. In one or more examples the method 400 further includes sampling by the sampling circuit 218 the at least one parameter 304 of the power converter device 204 wherein the at least one parameter 304 includes a current through at least one component of the power converter device.

The instructions and/or flowchart steps in the above figures can be executed in any order unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A controller for a power converter device, wherein the controller is configured to:
provide for switching of a switching component of the power converter device based on a feature in a control signal;
sample at least one parameter of the power converter device upon expiry of a predetermined time period after switching of the switching component; and
output the sample of the at least one parameter;
wherein the controller includes an analogue to digital converter, ADC, configured to sample the at least one parameter after the predetermined time period;
wherein the timer arrangement is configured to delay, by the predetermined time period, activation of a sampling window of the ADC within which the at least one parameter is sampled.

2. The controller of claim 1 wherein,
the controller being configured to sample the at least one parameter of the power converter device upon expiry of the predetermined time period comprises the controller being configured to:
activate a timer arrangement in response to detection of said feature in the control signal, and wherein
the timer arrangement is configured to delay, by the predetermined time period, the sampling of the at least one parameter of the power converter device.

3. The controller of claim 1 wherein,
the predetermined time period is user-defined and the controller includes a memory that is programmable for receiving the user-defined, predetermined time period, wherein the controller is configured to read the user-defined, predetermined time period from the memory and sample the at least one parameter of the power converter device upon expiry of the user-defined, predetermined time period after switching of the switching component.

4. The controller of claim 3 wherein,
the controller comprises at least one terminal and is configured to provide a programmable interface to receive an input at the at least one terminal to set the user-defined, predetermined time period that is stored in said memory.

5. The controller of claim 1 wherein,
the controller being configured to provide for switching of the switching component comprises the controller being configured to, in response to detecting the feature of the control signal, generate a further control signal configured for application to a control terminal of the switching component to at least one of open or close a conduction path through the switching component.

6. The controller of claim 1 wherein the predetermined time period comprises a first predetermined time period and the controller is configured to sample upon expiry of either the first predetermined time period or a different, second predetermined time period; wherein the controller is configured to:
sample a first parameter of the power converter upon expiry of the first predetermined time period after switching of the switching component; and
sample a second parameter of the power converter upon expiry of the second predetermined time period after switching of the switching component, wherein the second parameter is different to the first parameter.

7. The controller of claim 1 wherein the predetermined time period comprises a first predetermined time period and the controller is configured to sample upon expiry of either the first predetermined time period or a different, second predetermined time period; wherein the controller is configured to:
sample the at least one parameter of the power converter upon expiry of the first predetermined time period after switching of the switching component, wherein said switching comprises closing a conduction path through the switching component of the power converter device; and sample the at least one parameter of the power converter upon expiry of the second predetermined time period after switching of the switching component, wherein said switching comprises opening a conduction path through the switching component of the power converter device.

8. The controller of claim 1 wherein, the control signal comprises a logic control signal, and wherein the feature of the control signal comprises one or more of:
a rising edge of the logic control signal; and
a falling edge of the logic control signal.

9. The controller of claim 1, wherein the at least one parameter includes one of:
a temperature of the power converter device,
a voltage across at least one component of the power converter device, and
a current through at least one component of the power converter device.

10. The controller of claim 1 wherein the switching component comprises a power transistor that is controlled via a gate terminal and the controller includes a gate driver circuit to provide a voltage to the gate terminal to cause the switching component to switch based on the feature in the control signal.

11. The controller of claim 1 wherein the power converter device is an inverter and the switching component is a power transistor.

12. A system comprising the controller of claim 1 and an inverter for powering a load, wherein the system comprises one of:
a vehicle, and
an uninterruptible power supply, UPS.

13. A controller for a power converter device, wherein the controller is configured to:
provide for switching of a switching component of the power converter device based on a feature in a control signal;
sample at least one parameter of the power converter device upon expiry of a predetermined time period after switching of the switching component; and
output the sample of the at least one parameter;
wherein the controller includes an analogue to digital converter, ADC, configured to sample the at least one parameter after the predetermined time period;
wherein in response to detecting a first feature of the control signal, the ADC is configured to sample a first parameter of the power converter device, and in response to detecting a second feature of the control signal, the ADC is configured to sample a second parameter of the power converter device.

14. The controller of claim 13 wherein, the timer arrangement is configured to delay, by the predetermined time period, activation of a sampling window of the ADC within which the at least one parameter is sampled.

15. The controller of claim 13 wherein, the predetermined time period is user-defined and the controller includes a memory that is programmable for receiving the user-defined, predetermined time period, wherein the controller is configured to read the user-defined, predetermined time period from the memory and sample the at least one parameter of the power converter device upon expiry of the user-defined, predetermined time period after switching of the switching component.

16. The controller of claim 13 wherein, the controller being configured to provide for switching of the switching component comprises the controller being configured to, in response to detecting the feature of the control signal, generate a further control signal configured for application to a control terminal of the switching component to at least one of open or close a conduction path through the switching component.

17. The controller of claim 13 wherein the predetermined time period comprises a first predetermined time period and the controller is configured to sample upon expiry of either the first predetermined time period or a different, second predetermined time period; wherein the controller is configured to:
sample a first parameter of the power converter upon expiry of the first predetermined time period after switching of the switching component; and
sample a second parameter of the power converter upon expiry of the second predetermined time period after switching of the switching component, wherein the second parameter is different to the first parameter.

18. The controller of claim 13 wherein the predetermined time period comprises a first predetermined time period and the controller is configured to sample upon expiry of either the first predetermined time period or a different, second predetermined time period; wherein the controller is configured to:
sample the at least one parameter of the power converter upon expiry of the first predetermined time period after switching of the switching component, wherein said switching comprises closing a conduction path through the switching component of the power converter device; and
sample the at least one parameter of the power converter upon expiry of the second predetermined time period after switching of the switching component, wherein said switching comprises opening a conduction path through the switching component of the power converter device.

19. The controller of claim 13 wherein, the controller being configured to sample the at least one parameter of the power converter device upon expiry of the predetermined time period comprises the controller being configured to:
activate a timer arrangement in response to detection of said feature in the control signal, and wherein
the timer arrangement is configured to delay, by the predetermined time period, the sampling of the at least one parameter of the power converter device.

20. The controller of claim 13 wherein the switching component comprises a power transistor that is controlled via a gate terminal and the controller includes a gate driver circuit to provide a voltage to the gate terminal to cause the switching component to switch based on the feature in the control signal.

* * * * *